United States Patent [19]

Davis et al.

[11] Patent Number: 4,818,885

[45] Date of Patent: Apr. 4, 1989

[54] ELECTRON BEAM WRITING METHOD AND SYSTEM USING LARGE RANGE DEFLECTION IN COMBINATION WITH A CONTINUOUSLY MOVING TABLE

[75] Inventors: Donald E. Davis, Poughkeepsie; Samuel K. Doran, Wappinger Falls, both of N.Y.; Merlyn H. Perkins, New Fairfield; Hans C. Pfeiffer, Ridgefield, both of Conn.

[73] Assignee: International Business Machines Corporation, Armonk, N.Y.

[21] Appl. No.: 68,602

[22] Filed: Jun. 30, 1987

[51] Int. Cl.$^4$ .................................. H01J 37/304
[52] U.S. Cl. ........................ 250/492.2; 250/491.1; 250/398
[58] Field of Search ........... 250/492.2, 492.22, 492.23, 250/491.1, 398

[56] References Cited

U.S. PATENT DOCUMENTS

| Re. 31,630 | 7/1984 | Goto et al. | 250/492.2 |
|---|---|---|---|
| 3,900,736 | 8/1975 | Michail et al. | 250/492.2 |
| 3,900,737 | 8/1975 | Collier et al. | 250/492.2 |
| 4,063,103 | 12/1977 | Sumi | 250/492.2 |
| 4,477,729 | 11/0198 | Chang et al. | 250/492.2 |
| 4,494,004 | 1/1985 | Mauer et al. | 250/492.2 |
| 4,544,846 | 10/1985 | Langner et al. | 250/396 ML |

Primary Examiner—Bruce C. Anderson
Assistant Examiner—Jack I. Berman
Attorney, Agent, or Firm—Graham S. Jones, II

[57] ABSTRACT

This system employs writing of lithographic patterns with a shaped electron beam exposure system which minimizes the time wasted by workpiece positional requirements. The writing field contains an array of sub-fields written in a raster sequence. The large width of the writing field provided by the VAIL system reduces the number of mechanical scans required to write the pattern on the workpiece which further reduces the time required for workpiece positioning. When patterns are being superimposed over previously written patterns, registration is employed. This system includes a registration field confined to local areas on the workpiece, which is larger than the writing field, without requiring change in focus and without requiring the mechanical system comprising the X-Y work table to change speed during the registration and reregistration of the various fields on a semiconductor wafer or mask. The registration field can be larger than the writing field is possible because the quality requirements demanded from the shaped electron beam are less for detecting the locations of such registration marks at the various locations on the wafer.

7 Claims, 3 Drawing Sheets

ELECTRON BEAM WRITING METHOD AND SYSTEM USING LARGE RANGE DEFLECTION IN COMBINATION WITH A CONTINUOUSLY MOVING TABLE

FIELD OF THE INVENTION

This invention relates to an electron beam exposure system utilizing a shaped-electron-beam which is vector scanned within a sub-field and an electrical raster scan system for positioning sub-fields over a large rectangular area, and a continuously moving mechanical system for writing large patterns. More particularly it relates to a pattern writing system with a steered electron beam. This invention also relates to registration systems for accurately determining the target position relative to the electron beam position.

DESCRIPTION OF RELATED ART

U.S. Pat. No. 4,467,170 of Hata et al for "Electron Beam Drilling Apparatus" includes a system to control beam deflection to compensate for workpiece movement. The system uses an electron beam for drilling a continuously moving workpiece. See FIG. 4 of Hata et al. There is no registration cycle using the E-beams to check registration marks on the surface of the workpiece.

Commonly assigned U.S. Pat. No. 4,477,729 of Chang et al for "Continuously Writing Electron Beam Stitched Pattern Exposure System" describes a vector scanned E-beam exposure system for writing patterns on a substrate. It includes a continuously moving x-y table, and a laser interferometer control system. Workpiece movement commands are embedded within the pattern defining data to control relative movement between the workpiece and the writing field with respect to movement direction, velocity, and acceleration. Measurement of workpiece location is made by means of two axis laser interferometry, Col. 3, lines 56-59. No suggestion of measurement of the location of registration marks on the workpiece with an E-beam is suggested. Thus the deviation between the position of the workpiece on the table and the location of patterns on the workpiece deviating from the desired location is not taken into account. Only registration marks located on the workpiece within the area to be exposed can provide the desired registration information.

U.S. Pat. No. Re. 31,630 of Goto et al for "Electron Beam Exposure System" shows a shaped beam and a continuously moving table. The amount of workpiece shift is approximated by means of x and y laser interferometers which detect the position of the table, but no reregistration of the workpiece is provided. See Col. 2, lines 33-50.

U.S. Pat. No. 4,063,103 of Sumi for an "Electron Beam Exposure Apparatus" describes an E-beam exposure system with laser interferometry to control x-y table movement.

U.S. Pat. No. 3,900,737 of Collier et al for "Method and Apparatus for Positioning a Beam of Charged Particles" describes and E-beam system with continuously moving x, y table. At Col. 6, lines 51-56, Collier et al states as follows:

"Prior to exposure the exact alignment of the beam scan with respect to the table 21 is carried out by temporarily operating the exposure system as a convention scanning electron beam apparatus. During this latter mode of operation, the electron beam is controlled to scan the fiducial marks."

The system does not reregister the workpiece during operation but makes an assumption from Col. 6, lines 32-44, as follows:

"In addition, precise operation of the overall system presupposes an electron beam characterized by excellent short-term positional stability. As a practical matter, such stability of the beam is achievable in a well-engineered electron column (for example, one of the type disclosed in the above cited Lin application). But it is important to monitor and correct for any long-term drift of the electron beam stemming from, for example, electrical or thermal effects. Illustratively, this is done by periodically interrupting the aforedescribed exposure process and moving the table 21 to precisely determined positions. When the table is so positioned, the relatively stable beam can be expected to be directed approximately at preformed topographical features marked on the surface of the table (for mask fabrication) or on the surface of the wafer itself (for device fabrication). Illustrative registration or fiducial marks 65 through 68 are shown in FIG. 1."

Thus the table must be stopped and moved to align the E-beam with the fiducial marks and that involves the delay which is intended to be avoided by means of this invention while using the system of continuously driving the table supporting the workpiece.

U.S. Pat. No. 4,544,846 of Langner et al for "Variable Axis Immersion Lens Electron Beam Projection System", (commonly assigned) describes an E-beam system with a variable axis immersion lens (VAIL) (referred to below).

U.S. Pat. No. 3,900,736 of Michail et al for "Method and Apparatus for Positioning a Beam of Charged Particles" (commonly assigned) describes an E-beam exposure system with a computer driven correction system for use with a four corner registration system. The correction system operates dynamically to correct the deflection of an electron beam to minimize the deviation from desired alignment. Such alignment problems are caused by factors including the deviation of the position of the registration marks from their design positions.

The Hontas system of E-beam exposure employed by Michail et al has heretofore employed a step-and-repeat method of performing the tasks of registration, writing and transporting of the workpiece to expose each field of a multi-field pattern on a workpiece. Heretofore, the Hontas step-and-repeat system has employed an A cycle, a B cycle and a C cycle. During the A cycle, the workpiece has been registered while the workpiece on the transporting table was at rest. Then the B cycle has followed, during which time the pattern to be exposed has been written by the E-beam, while the workpiece and the table still remained at rest. Finally, only in the C cycle, has the table supporting the workpiece moved along its time consuming trip to the next location for exposing the next field on the workpiece.

The MEBES system provides continuous mechanical motion of the worktable supporting the workpiece, but it does not reregister the workpiece with respect to the E-beam during the process of exposing the entire workpiece. This has the advantage of speed since the reregistration steps are eliminated with the risk that the alignment of the workpiece and the E-beam deviates significantly from the desired alignment.

A problem with previous E-beam exposure systems has been that they either did not employ frequent registration of actual chip position, as with MEBES; or that if they did employ reregistration of chip position as with HONTAS, they required the system to stop in a step-and-repeat type of hesitation sequence. For example, the MEBES system employs a dead-reckoning type of positioning system with a continuous drive system with no reregistration checks during the process of E-beam exposure, with the assumption that the errors between the actual and desired location of patterns on the workpiece will be acceptable because tolerance requirements will be satisfied. The lack of frequent measurements of position in a dead reckoning type of system with continuous motion leads to a problem of alignment of the successive stages of exposure in a multilayer E-beam exposure system. The step-and-repeat system involves stopping the table carrying the workpiece to be exposed for registration and exposure or writing cycles, which requires extensive periods of time for stopping and starting the table. That start-stop time can be approximately equal to the time required to make the exposures.

With the tighter tolerances and smaller dimensions of VLSI chips being designed today, periodic reregistration to the workpiece and the E-beam position are becoming an essential feature of systems. With the economic pressures of high costs of manufacturing equipment and time delays required for E-beam exposure it is essential to maximize throughput of an E-beam system. Thus it is desirable to avoid the step-and-repeat system of exposure, to make the E-beam system more competitive with alternative technologies and to reduce overall costs of manufacture towards and optimum level.

SUMMARY OF THE INVENTION

Heretofore, it has been thought that the work table must be stopped for the purpose of reregistration of the workpiece, which has required a considerable time to start and stop the work table which is massive and accordingly has a long period of inertia in starting and stopping. Moreover, additional time is required for damping out of the overshoot and undershoot in table speed on reinitiating the operation of the drive system to a steady state. These factors greatly delay the operation of such a system.

Accordingly, an object of this invention is to provide a system for E-beam exposure which can perform the process of moving the workpiece simultaneously with the processes of registration of the workpiece and writing on the workpiece, so that the step-and-repeat type of delays of the table supporting the workpiece can be avoided and the errors inherent in a dead-reckoning type of system will be avoided.

In accordance with this invention, a system is provided for providing an electron beam system with a continuously moving table combined with means for registration of the workpiece relative to the electron beam system.

This invention relates to an electron beam exposure system utilizing a shaped-electron-beam which is vector scanned within a sub-field in combination with an electrical raster scan system for positioning sub-fields over a large rectangular area in combination with a continuously moving mechanical system for writing large patterns with a minimum of interruption. More particularly, it relates to a pattern writing system with a steered electron beam. This invention also provides a registration system using the electron beam to determine the target position accurately relative to the electron beam writing system.

In accordance with this invention, the system preferably employs writing of lithographic patterns with a shaped electron beam exposure system which minimizes the time wasted by workpiece positional requirements. Large lithographic patterns are written with subpatterns in sub-fields in a vector writing mode without interruption between successive sub-fields. This is made possible by continuously moving the workpiece in combination with the writing capability of a large rectangular writing field. The writing field contains a rectangular array of electronically positioned sub-fields which are written in a raster sequence. The large width of the writing field provided by the VAIL system reduces the number of mechanical scans required to write the pattern on the workpiece which further reduces the time required by workpiece positioning. The continuous velocity of the continuously moving workpiece during Y axis scans along a column on the wafer is corrected during writing to compensate for pattern density, maintaining an optimum workpiece position relative to the writing field. When patterns are being superimposed over previously written patterns, a means of registration is required since processing can cause workpiece distortions that are not detectable by position measurement systems. Accurate positioning of the overall workpiece relative to positional measurement systems is impractical due to thermal effects and other error sources. This system includes a registration field confined to local areas on the workpiece, which is larger than the writing field, which can be used for registration, without requiring a height-related change in focus and without requiring the mechanical system comprising the X-Y work table to change speed during the registration and reregistration of the various fields on a semiconductor wafer. The registration field can be larger than the writing field, because the quality requirements demanded from the shaped-electron-beam are less for detecting the locations of such registration marks at the various locations on the wafer.

The foregoing and other objects, features and advantages of the invention will be apparent from the more particular description of the preferred embodiments of the invention which follows.

DESCRIPTION OF THE PREFERRED EMBODIMENT

In accordance with this invention, a large lithographic pattern is written as quickly as possible by writing sub-field patterns in a vector scan mode. The sub-fields are positioned with a large field deflection system in combination with a continuously moving workpiece. This rectangular array of sub-fields provides several advantages which reduce the total time required to expose the workpiece (i.e. wafer or mask). The large field deflection capability provides registration capability on sparsely located registration marks by using the beam as a probe to locate the target fields accurately relative to the deflection systems. The advantages over prior art are:

1. A wide strip of sub-fields is written for each pass of the wafer, thus minimizing the number of passes required and the time required for reversing the work table motion and repositioning.

2. The large field deflection system provides the capability of positioning the sub-fields in a rectangular array thus providing a time buffer for dense and sparse patterns in the sub-fields. This capability reduces the velocity change requirements for the continuously moving work table.

3. Registration capability provides a more precise superposition of the written pattern over existing lithography.

Figure 1:
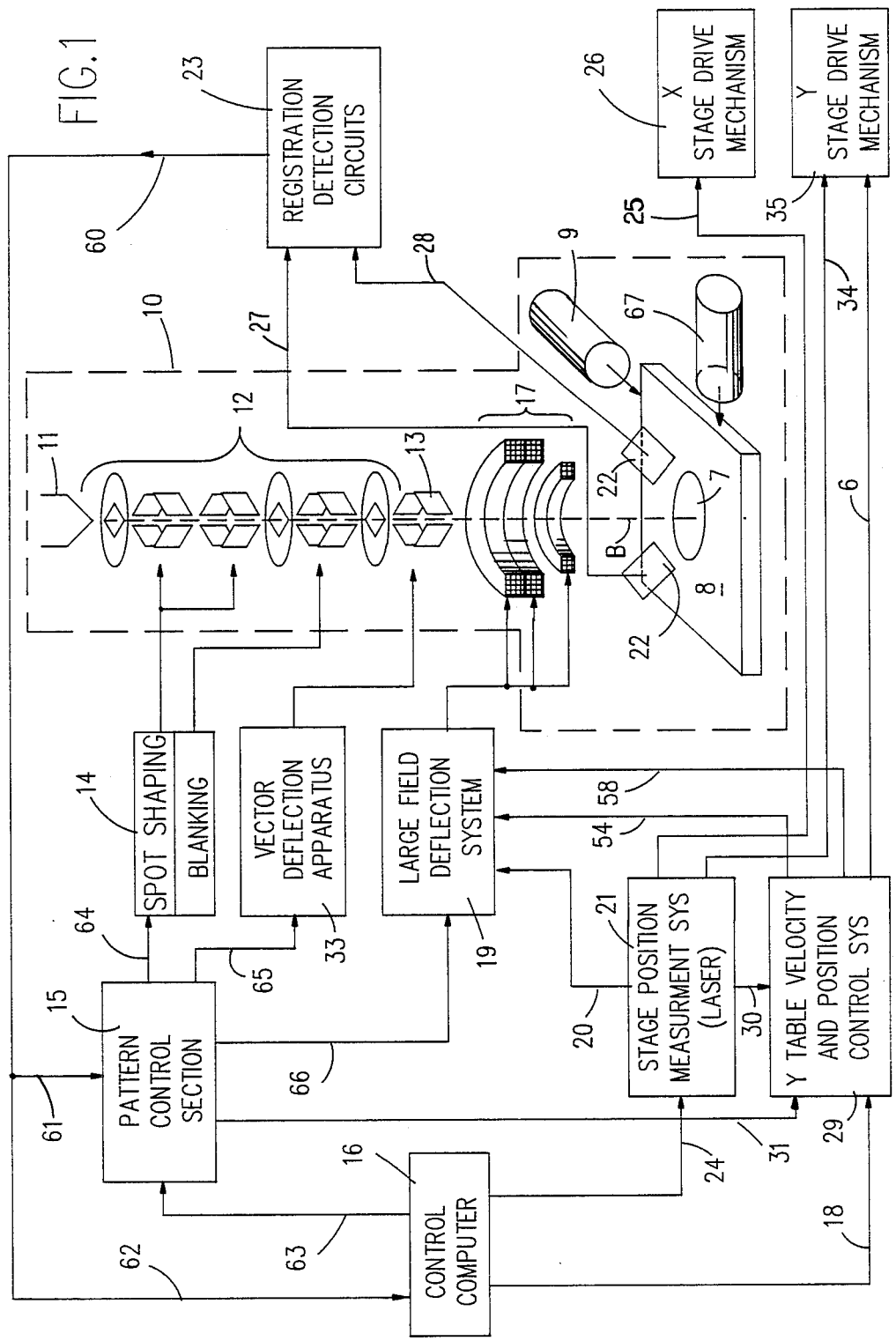
FIG. 1 is a block diagram of the electron beam exposure system showing the general details in accordance with this invention.

FIG. 1 generally illustrates a preferred embodiment of this invention. Referring to the E-beam writing process employed in accordance with this invention, continuous mechanical motion of the X-Y work table 8 beneath the E-beam B. The motion is generally provided along a serpentine, boustrophedontic path, as the oxen plow from one end of a column to the next column along the "Y" axis. Thus, the continuous motion occurs along one axis herein defined as the "Y" axis, whereas the motion at right angles to the X axis, at the end of each column, occurs as a step function at the end of each Y axis excursion in the direction referred to herein as the "X" axis. An E-beam exposure system is indicated generally by the phantom line 10. E-beam source 11 produces a beam B which is shaped into various spot shapes and blanked by the deflection and aperture apparatus 12, under the control of spot shaping apparatus and blanking apparatus, both located in unit 14 in accordance with Michail et al U.S. Pat. No. 3,900,736 cited above. The positioned and shaped spot is controlled, in part, by spot shaping, blanking analog electronics unit 14 under the control of digital electronics in pattern control section 15. This determines the pattern written in the sub-field under control of the control computer 16, as in Michail et al above. Pattern control section 15 supply signals on line 64 to unit 14. The shaped beam is vector positioned by the deflection apparatus 13 under the control of vector deflection apparatus 33. After each sub-field is completed the next sub-field is positioned by the large field deflection apparatus 17 under the control of large field deflection system 19. Pattern control section 15 supplies signals on line 66 to control deflection system 19. Preferably the large field deflection apparatus 17 incorporates a Variable Axis Immersion Lens arrangement as described in Langner et al U.S. Pat. No. 4,544,846. That arrangement permits the beam B to be deflected farther from the axis of the electron beam column to provide a large range writing capability.

The next sub-field is positioned orthogonally with respect to the direction of motion of the X-Y drive work table 8 which supports the workpiece 7 which is shown as a semiconductor wafer. However, at the edge of the writing field the exception is that the sub-field is positioned normally (or at right angles) with the direction of motion. The result of this sub-field positioning scheme in combination with a continuously moving work table 8 is a continuously moving, boustrophedontic raster scan. The raster scan positioning of the sub-fields is controlled by the large field deflection control system 19 containing electronic circuitry and pattern data from pattern control section 15. A motion compensating signal on line 20 from stage (work table) position measurement system 21 is received by large field deflection system 19 from the laser stage (work table) position measurement system 21. Measurement system 21 preferably directs a pair of laser beams at two edges of the work table 8 to measure table position as will be understood by those skilled in the art. The laser beams are omitted from the drawing to minimize confusing detail. Electronics in system 19 provide signals to the deflection apparatus 17 to compensate for X, Y, and angular errors resulting from the continuous motion of the work table 8 while sub-fields are being written.

The writing of patterns is temporarily stopped, typically after writing at a chip position on wafer 7 has been completed, and a reregistration cycle on wafer 7 is initiated. In the preferred embodiment, the beam B is deflected to the nominal location of four registration marks for the next chip on wafer 7 and four areas are scanned by the E-beam to probe the four areas. The actual positions of the registration marks (such as marks 39 in FIGS. 2 and 3) are detected by backscattered electrons which strike detectors 22. The signals from detectors 22 are fed on lines 27 and 28 to registration detection circuits 23 to determine the actual next chip position which provides a signal on lines 60 and 61 to pattern control section 15, and on lines 60 and 62 to the control computer 16. The designed chip position is supplied from control computer 16 on line 63 to the pattern control section 15. In pattern control section 15, the values on lines 63 and line 61, i.e. the designed chip position and the actual chip position, are compared, and corrections are applied on line 65 to the vector deflection apparatus 33. The registration cycle is alternated with writing cycles until the X-Y work table 8 arrives at the edge of the workpiece 7 which is a semiconductor wafer or mask. The work table 8 is moved along the X axis and the direction of motion in the Y axis is reversed starting the reregistration and writing cycles for the next column of chips. An alternate embodiment of the invention provides a two mark registration cycle with pairs placed more often on the edge of the writing field.

The X-Y mechanical drive work table 8 for moving the chip horizontally under the E-beam is controlled as follows. The X axis work table positioning is controlled by an X position signal included in an X/Y position signal on line 24 from control computer 16 to stage position measurement system 21. The signal on line 24 is predetermined by wafer specifications stored in the form of position control data in control computer 16 as modified by current registration signals received via lines 60 and 62 from registration detection circuits 23. The actual X position of work table 8 is determined by (laser) stage position measurement system 21 and that value is compared to the desired X position signal on line 24 from control computer 16. A resulting position error signal on line 25 is applied to a servo apparatus in the X stage drive mechanism 26 which applies a drive signal to motor 67 by lines omitted for convenience of illustration, as well known in the art. The Y table velocity and position control system 29 utilizes (1) a predetermined course velocity control signal on line 18 from control computer 16, (2) a laser LSB signal on line 30 from measurement system 21 which is used for determining actual table velocity, and (3) a sub-field position completion signal on line 31 from pattern control section 15 for determining velocity corrections.

A velocity control (position error) signal on line 6 from the control system 29 is applied to Y stage drive mechanism 35 which applies an input to control Y axis drive motor 9 by lines omitted for convenience of illustration. After a single scan of a column of chips is completed, the Y axis of the work table is positioned utilizing the methods described for X axis positioning by using the x/y position signal on line 34 and a position error signal on line 6. During this time between scans, the velocity control signal in the Y direction will be zero for an interval while the x-axis drive motor 67 moves the work table 8 to the next row. This is necessary since the scan is a serpentine scan in which the x-axis drive motor 67 is held still or halts its motion temporarily until the y drive motor 9 has reached the end of a row. Then, the y drive motor 9 remains still until the x drive motor 67 moves the work table 8 to the next row. Then the scan is continued for the new row in the opposite direction from the previous scan. A more detailed description of the Y axis table control system 29 follows below in connection with FIG. 4.

Figure 2:
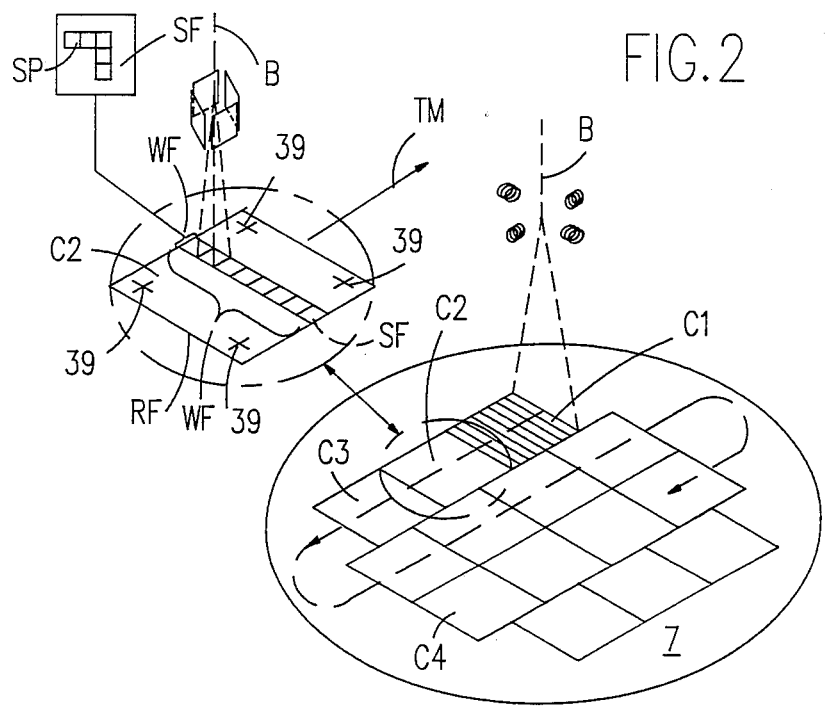
FIG. 2 is a plan view of the workpiece showing the relationships of the registration and writing strategy.

FIG. 2 further illustrates and clarifies the writing method employed in connection with this invention. The E-beam B is shown directed to a chip site C1 on wafer 7. The E-beam B exposes one chip at a time moving along the path from chip site C1, to chip site C2, to chip site C3, to chip site C4 as indicated by the dotted line path. The exploded view of a chip C2 in the circle on the upper left shows the chip site C2 with a large registration field RF with four registration points 39 and a writing field WF, which is a narrow stripe only 10 mm wide for a series of sub-fields on the chip site C2. The registration field RF is also known as a field comprised of a number of sub-fields SF, some of which are shown as squares within the writing field WF. The writing field WF and the registration field RF are covered by the large field deflection of the VAIL system. The direction of table movement TM is to the upper right. The exploded square SF indicates that sub-field vector writing is employed in accordance with the HONTAS system as described in the Michail et al patent, above. Spots SP are shown to illustrate the spots written by a conventional Hontas system.

Figure 3:
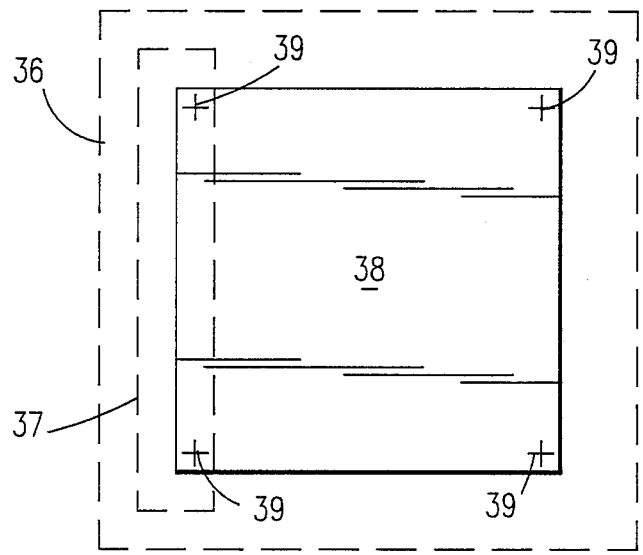
FIG. 3 illustrates the workpiece registration field and the pattern writing field employed in accordance with this invention.

FIG. 3 further illustrates the registration method employed with this invention, and the relative size of the registration deflection area 36 (i.e. registration field RF), and the writing deflection area 37 (i.e. writing field WF). The chip area 38, with its four corner registration marks 39, is also shown. Although the writing deflection area 37 is not capable of covering the complete chip area 38, it is seen that the registration deflection area 36 is larger than the chip area 38 and can reach the registration marks 39 in each of the four corners. The registration deflection area 36 can be larger than the writing deflection because the requirements on the spot edge acuity are less for the detection of registration marks than for pattern writing (larger deflections have inherently more spot distortion than smaller deflections). In the writing sequence, during the registration step the deflection of the beam B expands beyond area 36 to reach out to measure the location of the four registration marks 39, the field dimension are adjusted, so that, as the continuously moving table 8 brings the chip area 38 under the range of the writing deflection that the pattern being written has the proper translations and size to overlay the underlying pattern on the chip 38.

Figure 4:
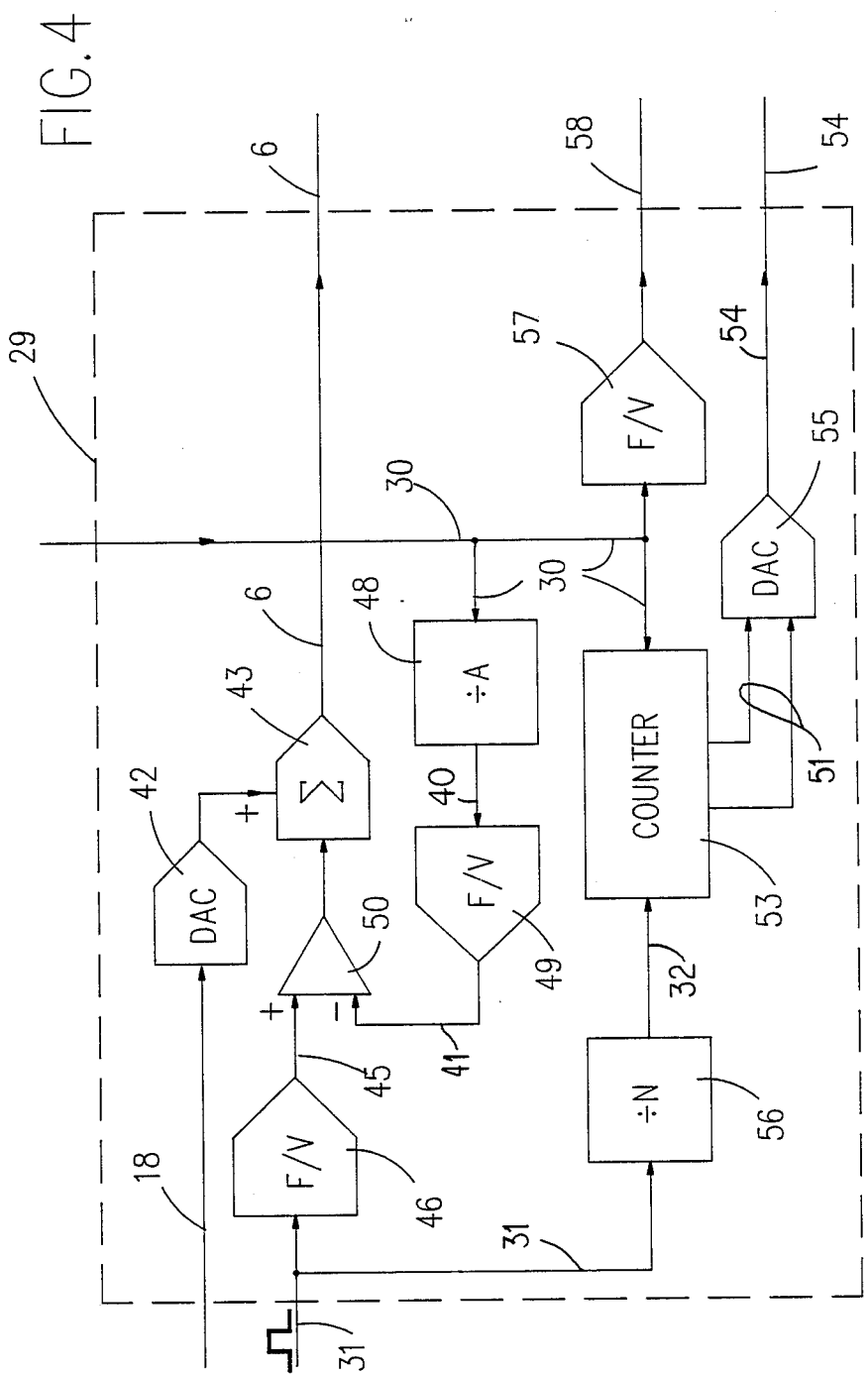
FIG. 4 shows a detailed block diagram showing the details of the velocity and position control and monitoring system.

FIG. 4 shows the detailed schematic diagram of control system 29 which operates the table 8 with continuous motion in accordance with this invention. Referring to FIG. 4, a course velocity control signal is received on line 18 from the control computer 16 in FIG. 1, as previously described. That signal on line 18 is based on a pre-analysis of the pattern density and the registration time requirements. The signal on line 18 is converted to an analog voltage by digital-to-analog converter (DAC) 42, which analog voltage is applied to summing amplifier 43. After the completion of a sub-field, the control system 29 receives a pulse on line 31 from pattern control section 15 in FIG. 1. That pulse is converted to an analog signal on line 45 by the frequency-to-voltage converter 46. The signal on line 45 is applied to difference amplifier 50. Laser LSB's on line 30 from the measurement system 21 are divided by digital divider circuits 48 providing its output on line 40 where the divisor "A" is proportional to the sub-field size and inversely proportional to the number of sub-fields per row. The output of the divider circuits 48 is applied to frequency-to-voltage converter 49. The output of converter 49 on line 41 is then applied to difference amplifier 50. Ideally, the output of the frequency-to-voltage converters 46 and 49 will be identical and therefore the output of the difference amplifier 50 will be "0". The output of the difference amplifier 50 is also applied to summing amplifier 43 as was the output of DAC 42. Deviations sensed by summing amplifier 43 will decrease or increase the velocity control signal on line 6 to Y stage drive mechanism 35 in FIG. 1. It can be recalled that the stage drive mechanism 35 controls motor 67 which drives the work table in the y direction in response to the signals on lines 6 and 34 in FIG. 1. Referring again to FIG. 4, the laser LSB signal on line 30 from FIG. 1 is also counted by digital circuits in counter 53 in FIG. 4. The output from counter 53 on lines 51 is converted to an analog signal on line 54 by digital-to-analog converter 55, whose output signal on line 54 to large field deflection control system 19 in FIG. 1 causes the deflection system 17 to follow the table motion.

Referring again to FIG. 4, after a complete row of sub-fields has been written, the counter 53 is reset by the output of the digital divider 56 carried on line 32. Since the divider 56 receives a pulse per sub-field on line 31 from the pattern control section 15 in FIG. 1, the beam B is placed in the proper position for writing the next row of sub-fields. The laser LSB signal on line 30 is also converted to an analog signal on line 58 by frequency-to-voltage converter 57, as a feed-forward signal to the large field deflection control system 19 in FIG. 1. This signal provides circuit delay compensation to the large field deflection system 17.

ALTERNATIVE DESIGNS

Industrial Applicability

This invention is applicable in manufacture and testing of VLSI chips.

Having described our invention, what we claim is new, and desire to secure by Letters Patent is:

1. Apparatus for writing, upon a workpiece supported on a work table, a pattern having a size larger than a pattern writing field, comprising:

(a) an electron beam means for generating a writing electron beam to be positioned anywhere within predetermined dimensions on said work table, (b) said work table transporting the position of said workpiece relative to said electron beam, (c) said workpiece having predetermined registration marks thereon, (d) control means for receiving position data and for generating control signals in response thereto having at least one input and at least one output, (e) said control means operating in accordance with a program for providing a predetermined pattern of exposure of said electron beam to said workpiece, (f) deflection means connected to a said output of said control means for providing deflection of an electron beam in response to said control means, (g) said electron beam means being juxtaposed with said deflection means, (h) drive means for continuously transporting said workpiece along a path relative to said electron beam, said drive means having an input connected to a said output of said control means, (i) registration detection means for providing a measurement of the position of said registration marks on said workpiece with respect to said electron beam without interruption of motion of said work table and said registration detection means including means for providing registration position data based upon said measurement to said control means simultaneously with the motion of said table, (j) said registration detection means having an output connected to a said input of said control means, and (k) said control means including means for generating workpiece position correction data relative to said work table as a function of the output of said registration detection means, (l) wherein said control means provides said position correction data for correcting said predetermined pattern of exposure as a function of said correction data.

2. Apparatus for writing, upon a workpiece, a pattern having a size larger than a pattern writing field, comprising:

(a) a work table for carrying said workpiece, (b) electron beam means for generating a shaped writing electron beam which may be positioned anywhere within predetermined dimensions on said work table, (c) said workpiece having predetermined registration marks thereon, (c) control means for receiving position data and for generating control signals in response thereto, said control means having at least one input and at least one output, (d) said control means including a program for a predetermined pattern of exposure of said electron beam to said workpiece, (e) deflection means for providing deflection of an electron beam, said deflection means having an input connected to an output of said control means to control said deflection means, (f) drive means for continuously transporting said workpiece along a continuous path relative to said electron beam, said drive means having a plurality of inputs with one thereof connected to a said output of said control means, (g) a velocity control system having an output connected to a said input of said drive means, and said velocity control system having an input connected to a said output of said control means, (h) registration detection means for providing a measurement of the position of said registration marks on said workpiece with respect to said electron beam without interruption of motion of said table and providing registration position data based upon said measurement to a said input of said control means, (i) work table position sensing means for measuring the workpiece transport mechanism position and velocity and providing corrections to control signals provided to said deflection means and to said velocity control system, (j) said control means generating workpiece position correction data relative to said work table, as a function of the output of said registration detection means and said work table position sensing means, and (k) said control means employing said position correction data for correcting said predetermined pattern of exposure as a function of said correction data.

3. Apparatus for writing, upon a workpiece, a pattern having a size larger than a pattern writing field, comprising:

(a) means for generating a shaped writing electron beam, (b) means for providing vector deflection of said shaped writing electron beam whereby said shaped writing electron beam may be positioned anywhere within the dimensions of a sub-field with said means for providing vector deflection, (b) a workpiece transport mechanism comprising a work table and drive means for continuously transporting said workpiece along a serpentine path relative to said electron beam without interruption of motion of said table for reregistration of the position of said workpiece and said table, (c) electron beam deflection means including a large field deflection system, (d) means for positioning said beam in a sub-field anywhere within a large deflection field using raster deflection methods and said large field deflection system, (e) means for positioning and controlling the velocity of said workpiece such that lithographic patterns may be written while said workpiece is in motion, (f) means for measuring the workpiece transport mechanism position and velocity and providing corrections to said deflection system and to said velocity control system, and (g) means for measuring workpiece positional errors relative to the workpiece transport mechanism and means for providing corrections to said beam deflection means.

4. Apparatus for writing, upon a workpiece, a pattern having a size larger than a pattern writing field, comprising:

(a) a work table for carrying said workpiece, (b) electron beam means for generating a shaped writing electron beam which may be positioned anywhere within predetermined dimensions on said work table, (c) control means for receiving position data and for generating control signals in response thereto, (d) said control means including a program for a predetermined pattern of exposure of said electron beam to said workpiece, (e) deflection means for providing deflection of an electron beam, said deflection means having an input connected to an output of said control means to control said deflection means, (f) drive means for continuously transporting said workpiece along a continuous path relative to said electron beam connected to an output of said control means, said drive means having a velocity control input (g) a velocity control system having an output connected to said velocity control input of said drive means, (h) registration detection means for measuring the position of said workpiece with respect to said electron beam without interruption of motion of said table and providing registration position data to said control means, (i) work table position sensing means for measuring the workpiece transport mechanism position and velocity and providing corrections to control signals provided to said deflection means and to said velocity control system, (j) said control means generating workpiece position correction data relative to the work table, as a function of the output of said registration detection means and said work table position sensing means, and (k) said control means employing said position correction data for correcting said predetermined pattern of exposure as a function of said correction data, (l) means for scanning a writing deflection area with a predetermined degree of beam focus with a predetermined degree of precision, and (m) means for moving said beam beyond said writing deflection area to registration points well beyond said writing defletion area for registering said workpiece relative to said beam to a plurality of registration points.

5. An electron-beam lithography apparatus comprising (a) an electron beam source work supporting surface, (b) a variable axis immersion lens cooperating with said electron beam source work supporting surface, (c) a continuously moving mechanical work table, (d) a registration deflection that is larger than the writing deflection, with sufficient resolution to maintain the registration accuracy within predetermined limits.

6. An electron-beam lithography apparatus for writing, upon a workpiece, a pattern having a size larger than a pattern writing field, comprising:

(a) a work table for carrying said workpiece, (b) electron beam means for generating a shaped writing electron beam which may be positioned anywhere within predetermined dimensions on said work table, (c) control means for receiving position data and for generating control signals in response thereto, (d) said control means including a program for a predetermined pattern of exposure of said electron beam to said workpiece, (e) deflection means for providing deflection of an electron beam, said deflection means having an input connected to an output of said control means to control said deflection means, (f) drive means for continuously transporting said workpiece along a continuous path relative to said electron beam connected to an output of said control means, said drive means having a velocity control input, (g) a velocity control system having an output connected to said velocity control input of said drive means, (g) registration detection means for measuring the position of said workpiece with respect to said electron beam without interruption of motion of said table and providing registration position data to said control means, (h) work table position sensing means for measuring the workpiece transport mechanism position and velocity and providing corrections to control signals provided to said deflection means and to said velocity control system, (i) said control means generating workpiece position correction data relative to the work table, as a function of the output of said registration detection means and said work table position sensing means, (j) said control means employing said position correction data for correcting said predetermined pattern of exposure as a function of said correction data, (k) an electron beam source work supporting surface, (l) a variable axis immersion lens projection system cooperating with said electron beam source work supporting surface, and (m) a continuously moving mechanical work table, a registration deflection that is larger than the writing deflection, with higher resolution over a larger area while maintaining the registration accuracy systems within predetermined limits.

7. A system for scanning an electron beam in a predetermined pattern over a surface of a workpiece having predetermined registration marks thereon, said system including a. means for providing a scanning electron beam, b. a continuously moving table for supporting a workpiece with its surface positioned to be exposed to said electron beam, c. table position means for providing a signal indicating the current position of said table, d. scanning means for scanning said electron beam over said surface to expose said surface with said beam, e. location means for determining location of said registration marks on said workpiece at the corners of an area upon which said electron beam is to write a pattern, said location means having an output, f. program means for controlling the scanning of said beam in a predetermined pattern in accordance with a predetermined program, and g. means for modifying said pattern in accordance with said output of said location means, and said output indicating the location of said table position means.

* * * * *